United States Patent [19]

Hatanaka et al.

[11] Patent Number: 4,532,536
[45] Date of Patent: Jul. 30, 1985

[54] PHOTO-ELECTRIC TRANSDUCER

[75] Inventors: Katsunori Hatanaka, Yokohama; Shunichi Uzawa, Tokyo, both of Japan

[73] Assignee: Canon Kabushiki Kaisha, Tokyo, Japan

[21] Appl. No.: 311,892

[22] Filed: Oct. 15, 1981

[30] Foreign Application Priority Data

Oct. 23, 1980 [JP] Japan .................................. 55-149075

[51] Int. Cl.$^3$ ...................... H01L 27/14; H01L 45/00; H01L 29/78; H01L 27/02
[52] U.S. Cl. .......................................... 357/30; 357/2; 357/15; 357/23.7; 357/32; 357/41; 357/59
[58] Field of Search ................... 357/30 K, 2, 15 LA, 357/24 LR, 23 TF, 59, 31, 32, 30 H, 30 I, 30 J, 30 C, 30 D, 23 R, 23 MG, 41, 42; 350/334

[56] References Cited

U.S. PATENT DOCUMENTS

| 3,385,731 | 5/1968 | Weimer | 37/23 TF |
| 3,493,812 | 2/1970 | Weimer | 357/23 TF |
| 3,969,751 | 7/1976 | Drukaoff et al. | 357/32 |
| 4,323,912 | 4/1982 | Koike et al. | 357/24 LR |
| 4,342,044 | 7/1982 | Ovshinsky et al. | 357/2 |
| 4,412,236 | 10/1983 | Sasano et al. | 357/31 |

FOREIGN PATENT DOCUMENTS 55-115378 5/1980 Japan ................................ 357/24 LR

OTHER PUBLICATIONS

P. G. Le Comber et al., "Amorphous–Silicon Field-Effect Device and Possible Application," Electronics Letters, vol. 15, (1979), pp. 179–181.

W. A. Anderson et al., "Surface State and Performance Evaluation of Schottky Barrier Solar Cells on Amorphous Silicon", Conference: Thirteenth IEEE Photovoltaic Specialists Conference, Washington, D. C., (1978), pp. 755–760.

Primary Examiner—Andrew J. James
Assistant Examiner—J. Carroll
Attorney, Agent, or Firm—Fitzpatrick, Cella, Harper & Scinto

[57] ABSTRACT

A photo-electric transducer comprises a photo-electric transducing element which includes a semiconductor layer formed of a photosensitive semiconductor material; first and second gate electrodes juxtaposed on the semiconductor layer through an insulating layer; a drain electrode disposed outside of the first gate electrode; a source electrode disposed outside of the second gate electrode; and an output electrode disposed between the drain electrode and source electrode on the semiconductor layer to take up output signals, wherein one of the area A of the semiconductor layer opposed to said first gate electrode and the area B of the semiconductor layer opposed to the second gate electrode is formed as light incidence part and the other area is formed as non-light incidence part.

19 Claims, 12 Drawing Figures

PHOTO-ELECTRIC TRANSDUCER

BACKGROUND OF THE INVENTION

1. Field of the Invention

The present invention relates to a photo-electric transducer adoptable in various image data processing apparatus such as a facsimile transmitter-receiver, a character reader and a copying machine.

2. Description of the Prior Art

Image sensors which have previously been known and most widely used in the above mentioned apparatus are one-dimensional photodiode type long sensors manufactured using crystalline silicon. However, such conventional sensors have some disadvantages. First, the available size of single crystal is limited; also the available machining technique has many limitations. Therefore, the length of photo-reception part of the sensor is greatly limited. Secondly, the sensor can be manufactured only with low yield.

The limited length of the photo-reception part of the known sensor brings forth various drawbacks. For example, when an original of A4 format of 210 mm in width is to be read using such sensor, it has been required conventionally to use a lens system through which the original is focused on the photo-reception surface of the sensor as a minified image. This method of reading employing an optical lens system is, of course, undesirable because it is contrary to the general desire to miniaturize the photosensor apparatus as a whole. Further, since it is impossible to increase the area of the individual photo-receptor elements, a large quantity of light is required to obtain a sufficiently large output signal from the input signal. Because of these limitations, such photosensors, have previously been adopted only in those apparatus which can spare a long time for reading and therefore operate at relatively low speed or in those applications for which high resolving power is not required.

SUMMARY OF THE INVENTION

Accordingly, it is an object of the invention to provide a photo-electric transducer which eliminates the drawbacks of the prior art apparatus mentioned above.

It is another object of the invention to provide a photo-electric transducer with which a sufficiently large output signal can be obtained from a very weak photo signal and reading can be carried out at high speed.

It is a further object of the invention to provide a photo-electric transducer whose photo-reception part can be elongated in a simple manner.

To attain the above objects, according to the invention, there is provided a photo-electric transducer comprising a photo-electric transducing element comprising a semiconductor layer formed of photosensitive semiconductor material, first and second gate electrodes juxtaposed on the semiconductor layer through an insulating layer, a drain electrode disposed on the semiconductor layer and located at the outside of the first gate electrode, a source electrode disposed on the semiconductor layer and located at the outside of the second gate electrode and an output electrode for picking up output signals disposed on the semiconductor layer and located at the area between the drain electrode and the source electrode, wherein any one of the area A of the semiconductor layer opposed to the first gate electrode and the area B opposed to the second gate electrode is formed as a light incidence part and the other area is formed as a non-light incidence part.

Other and further objects, features and advantages of the invention will appear more fully from the following description taken in connection with the accompanying drawings.

BRIEF DESCRIPTION OF THE DRAWINGS

FIG. 3 schematically shows an embodiment of the invention wherein

FIG. 5 schematically shows a third embodiment of the invention wherein

DETAILED DESCRIPTION OF PREFERRED EMBODIMENTS

Figure 1:
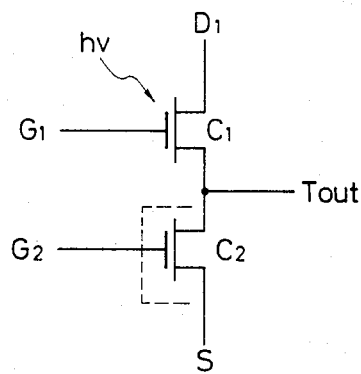
FIG. 1 is an equivalent circuit diagram of a photo-electric element used in the invention.

In the photo-electric transducer according to the invention, the photo-electric transducing elements constituting the transducer have a structure of a thin film field-effect transistor (hereinafter referred to as TFT) formed of an amorphous semiconductor (hereinafter referred to as a-semiconductor) material or a polycrystalline semiconductor (hereinafter referred to as poly-semiconductor) material. This structure brings forth particular advantages. The length of the photo-reception part can be selected at will. For example, such a long photo-electric transducer having a photo-reception part as long as or longer than the original to be read can be designed and manufactured very easily. Further, the manufacture can be carried out with a good yield. Another particular advance of this structure is found in that the density of received photo picture elements can be increased easily to provide a photo-electric transducer having a high resolving power.

As described above, the photo-electric transducer according to the invention includes a semiconductor layer formed of photosensitive semiconductor material. Examples of the photosensitive semiconductor material useful for forming the semiconductor layer include: Polycrystalline silicon (hereinafter abbreviated to poly-Si); amorphous silicon containing, as the host, a silicon atom and, in addition, at least one of a hydrogen atom (H) and a halogen atom (X), which is hereinafter abbreviated to a-Si (H,X); polycrystalline silicon containing at least one of a hydrogen atom (H) and a halogen atom (X) in addition to the matrix, silicon atom (abbreviated to poly-Si(H,X)); polycrystalline germanium (poly-Ge); amorphous germanium containing at least one of a hydrogen atom (H) and a halogen atom (X) in addition to the matrix, germanium atom (a-Ge(H,X)); polycrystalline germanium containing at least one of a hydrogen atom (H) and a halogen atom (X) in addition to germanium atom as the matrix (poly-Ge(H,X)); Se-Te system non-crystalline substances and polycrystalline substances such as CdS.

Among them, a-Si(H,X), a-Ge(H,X) and poly-Ge (H,X) are preferred for the following reasons:

Their conductivity can be controlled easily to form p-type or n-type by impurity doping. They are not or substantially not contaminative to environment. Their photosensitivity range covers the range of relative luminosity. They are excellent in reponsiveness of light. A glow discharge decomposition technique or a sputtering technique can be employed to form the semiconductor layer, which makes it possible to give a desired characteristic to the photo-reception part uniformly throughout all of its area even when the area is made large.

When the photosensitive semiconductor layer of a-Si (H,X) system or a-Ge(H,X) system is to be formed, for example, by employing the glow discharge decomposition technique, it is accomplished in the following manner:

Gaseous or easily gasifiable silicon hydride (silane) such as $SiH_4$, $Si_2H_6$, $Si_3H_8$, $Si_4H_{10}$ or the like, silicon halide such as $SiF_4$, $Si_2F_6$, $SiCl_4$, $SiBr_4$ or the like, silicon hydride substituted by halogen such as $SiH_2F_2$, $SiH_2Cl_2$, $SiHCl_3$, $SiH_2Br_2$, $SiHBr_2$ or the like, or gaseous or easily gasifiable germanium hydride such as $GeH_4$, $Ge_2H_6$, $Ge_3H_8$, $Ge_4H_{10}$ or the like, alone or in combination thereof; and, if necessary, $H_2$ for introducing hydrogen atom and/or halogen gas such as fluroine, chlorine, bromine or iodine, or gaseous or easily gasifiable interhalogen compound such as BrF, ClF, $ClF_3$, $BrF_5$, $BrF_3$, $IF_7$, $IF_5$, ICl, IBr or the like for introducing halogen atom are introduced into a deposition chamber for glow discharge decomposition, together with a rare gas such as He, Ne or Ar serving as dilution gas so as to initiate glow discharge and make a-Si(H,Z) or a-Ge(H,X) deposited on a selected substrate.

In order to form the a-Si(H,X) or a-Ge(H,X) system semiconductor layer as that of p-type, the layer is doped, during the formation of the layer, with an impurity selected from the IIIA Group elements of the Periodic Table, such as B, Al, Ga, In, Tl and the like. If n-type is desired to form, the layer is doped with an impurity selected from the V Group elements such as N, P, As, Sb, Bi and the like during the formation of the layer.

The a-Si(H,X) or a-Ge(H,X) system semiconductor layer according to the invention contains H or X or H+X usually in an amount of 1 to 40 atomic % and preferably in an amount of 5 to 30 atomic %.

Hereinafter, the present invention will be described more concretely with reference to preferred embodiments of the invention shown in the accompanying drawings.

Referring first to FIG. 1, there is shown an equivalent circuit of the photo-electric transducer according to the invention.

A light transmissible gate electrode G1 functions as a first gate, and a light shielding gate electrode G2 functions as a second gate. The first and second gates are biased to their optimum potentials respectively. A power source is supplied between drain $D_1$ and source S. An output voltage appears on an output terminal Tout. The level of the output corresponds to the quantity of light incident on a first channel C1 lying directly above the first gate. C2 designates a second channel.

One of the most important features of the photo-electric transducer according to the present invention is that the first and second channels C1 and C2 are disposed closely to each other and formed as MIS structure TFT having substantially the same characteristic. Owing to this feature, nearly the same threshold voltage (Vth) and nearly the same mutual conductance (Gm) are obtainable from different channels (as the gate conductors may be different from each other, a suitable bias is applied to the gates substantially to equalize the threshold voltages Vth). Therefore, when the photo-electric transducer is formed of a plural number of photo-electric transducing elements, the distribution of output characteristics between elements becomes a value negligible relative to the gain of photo-electric conversion. Also, the distribution of Gm becomes one which can chiefly affect only the distribution of element output impedance, and the distribution of Vth can affect only the distribution of normal potential of element output voltage (in case that fixed bias system is used).

Another important advantage of the photo-electric transducing element according to the invention is found in that the output terminal Tout can be brought into a high impedance state by controlling the voltage on the first and second gates. This advantage makes it possible to connect the output terminals mutually (tristate connection) when a number of photo-electric transducing elements are arranged. Therefore, the scanning circuit and wiring can be simplified to a great extent, which is of great advantage to the production thereof.

Figure 2:
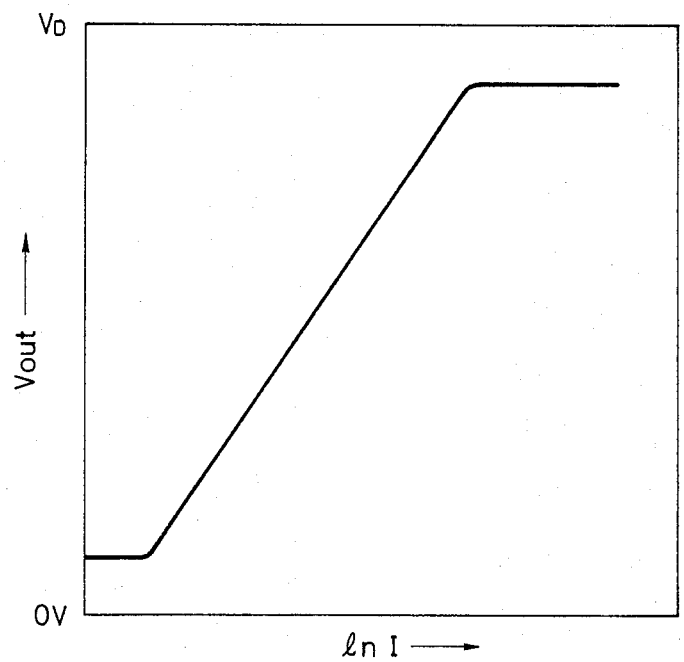
FIG. 2 is a photo-electric characteristic curve thereof.

FIG. 2 shows the photo-electric conversion characteristic of the photo-electric transducing element constituting the photo-electric transducer according to the invention. From the characteristic curve it is readily understood that there is obtained output signal substantially equal to the source voltage (voltage between drain and source) and therefore a sufficiently large conversion gain can be obtained by the photo-electric transducer according to the invention.

Figure 3A:
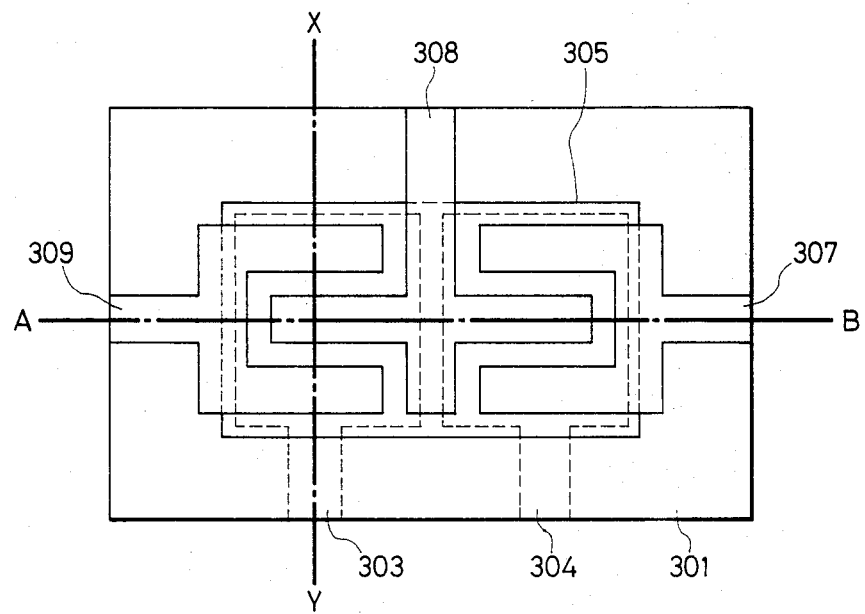
FIG. 3A is a plan view thereof.
Figure 3B:
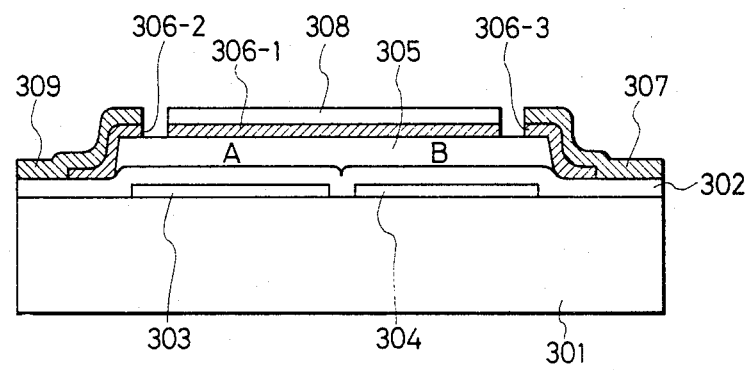
FIG. 3B is a partial sectional view along A-B in FIG. 3A
Figure 3C:
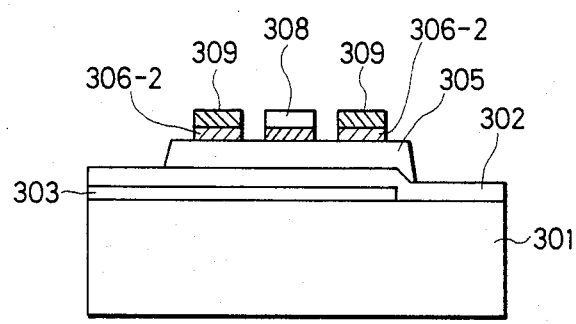
FIG. 3C is a partial sectional view along X-Y in FIG. 3A.

FIGS. 3A to C show a preferred embodiment of the invention.

FIG. 3A is a plan view thereof, FIG. 3B is a partial sectional view along chain-dotted line A-B in FIG. 3A and FIG. 3C is a partial sectional view along chain-dotted line X-Y in FIG. 3A.

301 is a substrate, 302 is an electrically insulating layer, 303 is a first gate electrode, 304 is a second gate electrode and 305 is a semiconductor layer formed of a photosensitive semiconductor material. Designated by 306-1, 306-2 and 306-3 is a junction layer for forming ohmic junction. 307 is a source electrode, 308 is an output electrode for taking up output signals, and 309 is a drain electrode.

The part of the semiconductor layer 305 designated by A is the area opposed to the first gate electrode 303. Another part of the semiconductor layer 305 designated by B is the area opposed to the second gate electrode 304. In the photo-electric transducer shown in FIG. 3, the two areas A and B of the semiconductor layer are so formed that any one of the areas A and B constitutes a light incidence area on which light is incident and the other area constitutes a non-light incidence area on which light is not incident.

For instance, if the photo signal is to be put into the transducer from the side of the substrate 301, one of the first and second gate electrodes 303 and 304 is formed of such material which transmits the light to which the semiconductor layer 305 is sensitive, and the other is formed of such material which cuts off the light. Alternatively, a light shielding layer is provided on the surface of one electrode which is to be made non-transmissive to the light, or at the area opposed to the surface. In this manner, one of the areas A and B of the semiconductor layer is made a light incidence area, and the other area is made a non-light incidence area.

If the photo signal is put in to the transducer from the side of the output electrode 308, the light incidence area can be formed on the semiconductor layer 305 by making it transmissive to the above mentioned light at the area of the output electrode opposed to either the first gate electrode 303 or the second gate electrode 304. The non-light incidence area can be formed by making the remaining area of the output electrode an area which does not transmit the incident light.

To make the output electrode 308 transmissive to the light at its one part and not transmissive at the remaining part as described above, various methods may be employed. For example, it may be attained by forming the output electrode 308 itself using a material which is transmissive to the light and then forming a light shielding layer by covering only the portion of the electrode to be made not transmissive to the light. As another method, the light transmissible portion of the electrode may be formed from a light transmissible electrode material, and the light shielding portion may be formed from electrode material which does not transmit light.

As for electrodes or electrode portions other than the electrodes or electrode portions located at the position corresponding to the light incidence area of the semiconductor layer 305 on the light incidence side, it is desirable that such electrodes or electrode portions should be provided with light shielding means to prevent any stray light from entering the light incidence area of the semiconductor layer 305.

In the case of the arrangement shown in FIG. 3, to efficiently take up the output signals from the output electrode 308, it is preferable that the area A of the semiconductor layer 305 be the light incidence area and that the photo signal is put in from the first gate electrode 303.

When the photo signal is made incident on the semiconductor layer 305 from the side of the substrate 301, the substrate 301 should be made of such material which is transmissive to the light to which the semiconductor layer 305 is sensitive. Examples of such transmissive material include glass, No. 7059 glass (supplied by Corning Glass Works), magnesia, beryllia, spinel and yttrium oxide.

When the first and second gate electrodes 303 and 304 must be made of light transmissive material, there may be used, for example, $SnO_2$, ITO (indium tin oxide) and $In_2O_3$ which are light transmissive and electroconductive materials. In this case, a portion of the electrodes may be covered with light intransmissive electrode material such as metal and the like to define the area of picture element. When the electrodes must be made of light shielding material, there may be used, for example, Al, Cr, Mo and Pt which block the light very well.

The upper surface of the first and second gate electrodes is in contact with the insulating layer 302. The thickness of the insulating layer 302 is suitably selected to attain an effective channel control by the first and second gate electrodes 303 and 304. The thickness is generally in the range of 500 Å to $1\mu$ and preferably in the range of from 1000 Å to 5000 Å.

Preferred materials for the insulating layer 302 are, for example, $Si_3N_4$ by glow discharge process, $SiO_2$ by sputtering process and $SiO_2$ by CVD process.

The thickness of the semiconductor layer 305 is determined suitably so as to allow the optimum formation of photo carrier by incident light and the most effective transportation of the formed carrier without any unnecessary enlargement of the channel width. The semiconductor layer 305 according to the invention has a thickness generally in the range of from 0.01 to $5\mu$, preferably from 0.1 to $2\mu$ and most preferably from 0.5 to $1\mu$.

The output electrode 308 is opposed to the first and second gate electrodes 303 and 304 on the semiconductor layer 305 through the junction layer 306-1. At one side of the output electrode 308 there is provided the drain electrode 309 through the junction layer 306-2. The source electrode 307 is provided at the other side of the output electrode through the junction layer 306-3. The junction layer 306 is so disposed as to provide an ohmic junction between the semiconductor layer 305 and each electrode 307, 308, 309. For example, when the semiconductor layer 305 is formed of a non-doped a-Si(H,X) or i-type a-Si(H,X), the junction layer is formed by n+ type a-Si(H,X). If the semiconductor layer 305 is formed of a non-doped a-Ge(H,X) or i-type a-Ge(H,X), then the junction layer is formed by n+ type a-Ge(H,X). The ohmic junction formed between the electrodes 307, 308, 309 and the semiconductor layer 305 may be replaced by Schottky junction.

If it is desired to form Schottky junction, the latter will be obtained by providing a Schottky junction layer between the electrodes 307, 308, 309 and the semiconductor layer 305 or by making the electrodes 307, 308, 309 from such material which can form Schottky junction between itself and the semiconductor layer 305. For example, when the semiconductor layer 305 is formed of non-doped a-Si(H,X) or i-type a-Si(H,X), the desired Schottky junction can be formed by using a metal material such as Au, Ir, Pt, Ni, W or stainless steel. These metal materials can be used also as preferred Schottky junction forming materials in the case where the semiconductor layer 305 is formed of a non-doped a-Ge(H,X) or i-type a-Si(H,X).

Figure 4:
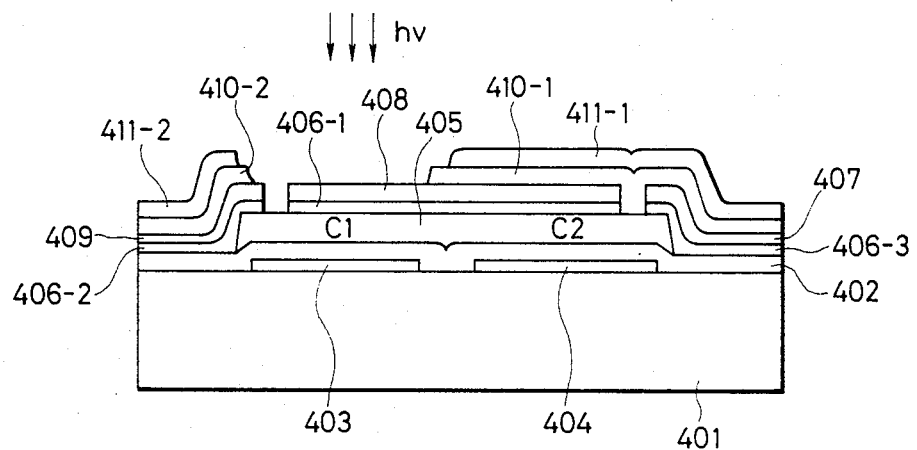
FIG. 4 schematically shows a second embodiment of the invention.

FIG. 4 is a view similar to FIG. 3B and shows a second embodiment of the invention.

In the photo-electric transducer shown in FIG. 4, the input of photo signal $h\nu$ is made from the side opposite to the substrate 401 and toward the light incidence area (first channel area C1) of the semiconductor layer 405.

The second channel area C2 is non-light incidence area. To shield the second channel C2 from the incident light, a shield layer 411 is provided on the surface portion corresponding to the area C2 through an electrically insulating layer 410. The shield layer 411 is provided also on the source electrode 407 and drain electrode 409 through the insulating layer 410. Thus, all the elements are covered with the shield layer except the portion corresponding to the first channel area C1. This shield layer has an effect to prevent the entrance of any stray light into the first and second channel areas C1 and C2.

Suitable materials for the shield layer 411 are Al, Cr, Mo etc. Preferred materials for forming the insulating layer 410 are $Si_2N_4$ by glow discharge process, $SiO_2$ by sputtering process and $SiO_2$ by CVD process.

Since the first and second gate electrodes 403 and 404 are not on the light incidence side, it is desirable that the gate electrodes be nontransmissive to the light. For example, the electrodes 403 and 404 are made of light intransmissible metal electrode material. The same purpose may be attained by providing a shield layer between the electrodes and the substrates 401 or on the surface of the substrate 401 on the side opposite to the gate electrodes. Also, it may be attained by forming the substrate 401 itself from such material which blocks light, for example, using an opaque ceramic material.

Figure 5A:
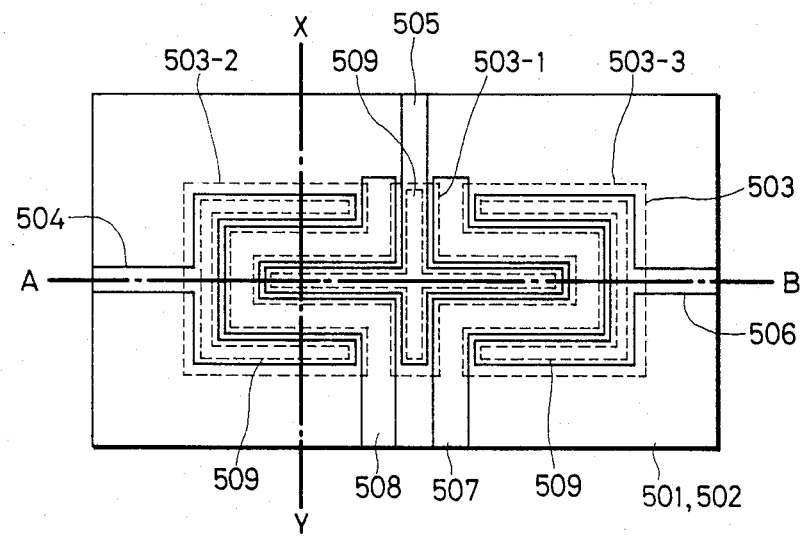
FIG. 5A is a plan view thereof.
Figure 5B:
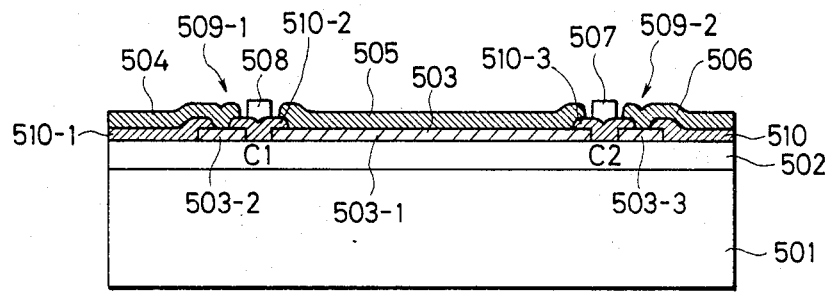
FIG. 5B is a partial sectional view along A-B in FIG. 5A
Figure 5C:
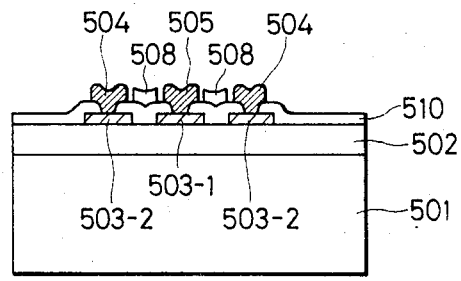
FIG. 5C is a partial sectional view along X-Y in FIG. 5A.

FIG. 5 shows a third embodiment of the invention. FIG. 5A is a plan view thereof, FIG. 5B is a partial sectional view along chain-dotted line A-B in FIG. 5A and FIG. 5C is a partial sectional view of the same along chain-dotted line X-Y in FIG. 5A.

In this embodiment, the first and second gate electrodes, source electrode, drain electrode and output electrode are all arranged on the same side of the semiconductor layer.

Light is made incident on the photo-electric transducer from the side opposite to the substrate 501. Therefore, not only light transmissible material but also light non-transmissible material may be used for forming the substrate. The semiconductor layer 502 is formed on the top surface of the substrate 501. In a determined area of the upper surface of the semiconductor layer 502 there is provided a junction layer 503 for forming an ohmic junction or Schottky junction.

The semiconductor layer 502 and the junction layer 503 are covered with an insulating layer 510 except the portions where contact holes 509 are provided for lead-out of the source electrode 506, drain electrode 504 and output electrode 505.

These electrodes 506, 505 and 504 passing through the contact holes 509 are electrically connected with the junction layer 503. Also, on the first and second channel areas C1 and C2 there are formed a first gate electrode 507 and a second gate electrode 508 which are electrically insulated by the insulating layer 510. Since the first channel area C1 constitutes the light reception area in this embodiment, the first gate electrode 507 on the area C1 is made of light transmissible material.

Other electrodes, the second gate electrode 508, source electrode 506, output electrode 505 and drain electrode 504 are preferably formed of non-transmissive materials. If any light transmissive material is used for these electrodes, then it is required to shield the portion of the second channel area C2 from light.

A line image sensor can be formed by arranging a plural number of photo-electric transducing elements as shown in the above embodiments. An embodiment of such line image sensor will be described hereinafter with reference to FIG. 6.

Figure 6:
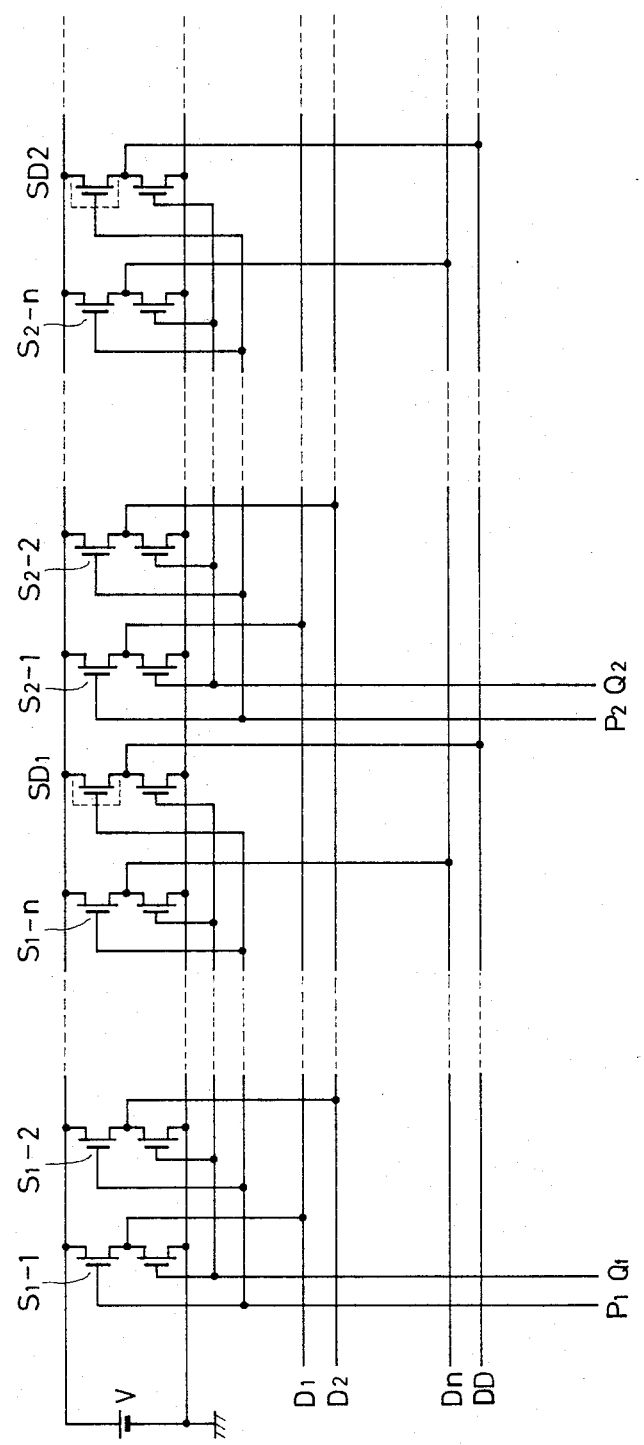
FIG. 6 is a circuit diagram showing a portion of the electric circuit of a fourth embodiment.

FIG. 6 shows an equivalent circuit of the line image sensor.

The line image sensor comprises a group of photo-electric transducing elements $S_1$-1 to $S_m$-n and a group of compensating elements SD1 to SDm. Each of the photo-electric transducing elements has the same structure as shown in FIGS. 3 to 5. The manner of electrode wiring is not shown in FIG. 6 because it does not directly relate to the subject of the present invention. The structure of each of the compensating elements is essentially the same as that shown in FIGS. 3 to 5 with the exception that in the compensating element, the light incidence area is also shielded from light. Such compensating elements are used to improve further the conversion rate of the quantity of incident light. The primary function of the compensating elements SD1-SDm is to produce a compensation signal for compensating the output signals from the photo-electric transducing elements $S_1$-1 to $S_m$-n relative to the changes of external conditions such as the distribution of photo-electric conversion characteristics and temperature.

Figure 7:
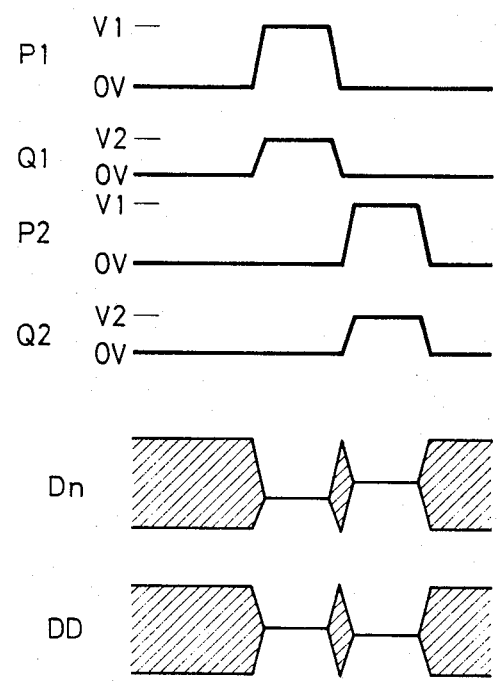
FIG. 7 is a timing chart showing the timing of operations.

As seen in FIG. 6, output terminals of the photo-electric transducing elements $S_1$-1 to $S_m$-n and compensating elements SD1 to SDm are connected by wiring in $m \times (n+1)$ matrix wherein m and n are positive whole numbers. The output signals from the photo-electric transducing elements are controlled by common first gate lines $P_1$-$P_m$ and common second gate lines $Q_1$-$Q_m$, respectively. For instance, if $P_1$ and $Q_1$ are held at ground level, then the output lines of the photo-electric transducing elements $S_1$-1~$S_1$-n and SD1 are in a high impedance state. When a suitable potential is applied to $P_1$ and $Q_1$ ($P_1=V_1$, $2_1=V_2$ in FIG. 7), a signal voltage corresponding to the quantity of incident light and a compensating signal voltage are generated at the respective outputs of the above mentioned elements. However, in this case, there is the provision that other lines, $P_2$-$P_m$ and $Q_2$-$Q_n$ are at ground level.

Therefore, in the line image sensor of this embodiment, when ($P_1$, $Q_1$), ($P_2$, $Q_2$), ... ($P_m$, $Q_m$) are sequentially and exclusively driven with the timing shown in FIG. 7, there appears on the common signal lines $D_1$-$D_m$, DD sequentially output voltages of ($S_11$~$S_1$-n, $SD_1$), ($S_2$-1 $S_2$-n, $SD_2$), ....

Figure 8:
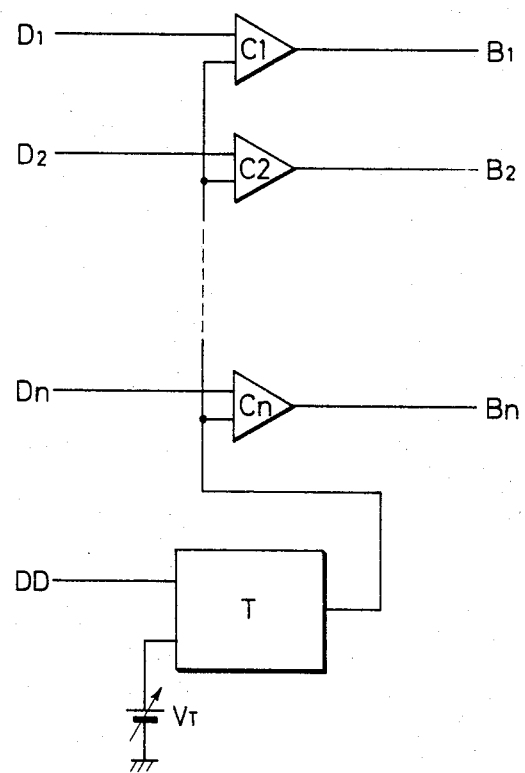
FIG. 8 is a block diagram of a signal processing circuit.

FIG. 8 is a block diagram of a signal processing circuit useful for binarization of the output produced from the line image sensor shown in FIG. 6. Signal potentials appearing on the common signal lines $D_1$-$D_m$ are compared with a comparison voltage determined by a comparison voltage control circuit T. The comparison voltage is determined by a calculation (usually addition with a weight) from the compensating signal appearing on the common signal line DD and a preset threshold voltage. Voltage comparators $C_1$-$C_n$ compare the signal potentials with the comparison voltage to make up binary signals $B_1$-$B_n$ respectively which are further transmitted to the next step.

While the invention has been particularly shown and described with reference to preferred embodiments thereof, it will be understood by those skilled in the art that the foregoing and other changes in form and details can be made therein without departing from the spirit and scope of the invention.

What we claim is:

1. A photo-electric transducer having a photoelectric transducing element comprising:
   a semiconductor layer formed of a photosensitive semiconductor material;
   first and second gate electrodes juxtaposed on said semiconductor layer through an insulating layer;
   a drain electrode disposed outside of said first gate electrode;
   a source electrode disposed outside of said second gate electrode; and
   an output electrode disposed between said drain electrode and said source electrode on said semiconductor layer to provide output signals, wherein one of an area A of said semiconductor layer opposed to said first gate electrode and an area B of the same opposed to said second gate electrode is formed as a light incidence part and the other area is formed as a non-light incidence part.

2. A photo-electric transducer as set forth in claim 1, wherein said semiconductor material is an amorphous semiconductor material.

3. A photo-electric transducer as set forth in claim 1, wherein said semiconductor material is a polycrystalline semiconductor material.

4. A photo-electric transducer as set forth in claim 1 or 2 or 3 wherein the area A of said semiconductor layer is the light incidence part.

5. A photo-electric transducer as set forth in claim 1 or 2 or 3 wherein an ohmic junction is formed between said semiconductor layer and each of the said drain electrode, source electrode and output electrode.

6. A photo-electric transducer as set forth in claim 1 or 2 or 3 wherein a Schottky junction is formed between said semiconductor layer and each of the said drain electrode, source electrode and output electrode.

7. A photo-electric transducer as set forth in claim 1 or 2 or 3, wherein said output electrode is opposite said first and second gate electrodes through said semiconductor layer.

8. A photo-electric transducer as set forth in claim 1 or 2 or 3, wherein first and second gate electrodes are disposed in juxtaposition on a surface side of said semiconductor layer.

9. A photo-electric transducer as set forth in claim 5, wherein said ohmic junction is formed through an n+ semiconductor layer.

10. A photo-electric transducer as set forth in claim 9, wherein said n+ semiconductor layer is formed of amorphous material.

11. A photo-electric transducer as set forth in claim 4 wherein said first gate electrode is made transmissive to the light to which said semiconductor material is sensitive and said second gate electrode is non-transmissive to the same light.

12. A photo-electric transducer as set forth in claim 11, wherein said second gate electrode is provided with a light shielding layer.

13. A photo-electric transducer as set forth in claim 11, wherein said second gate electrode is formed of a metal material which is non-transmissive to light.

14. A photo-electric transducer as set forth in claim 11 wherein said output electrode is not transmissive to the light to which said semiconductor material is sensitive.

15. A photo-electric transducer as set forth in claim 1, wherein $m \times n$ in number of photo-electric transducing elements are arranged in juxtaposition, wherein m and n are positive whole numbers.

16. A photo-electric transducer as set forth in claim 2 or 3, wherein said amorphous semiconductor material contains one of a silicon atom and a germanium atom as the host and further at least one of a hydrogen atom and a halogen atom.

17. A photo-electric transducer as set forth in claim 15, wherein said photo-electric transducing elements are grouped into a plural number of groups, each group containing at least one photo-electric transducing element and being provided with a compensating element to compensate individually the output signal of each group.

18. A photo-electric transducer as set forth in claim 17, wherein said compensating element has substantially the same structure as said photo-electric transducing element except the areas A and B of said compensating element are both non-light incidence parts.

19. A photo-electric transducer as set forth in any one of claims 1, wherein said output signal is a voltage signal.

* * * * *

UNITED STATES PATENT AND TRADEMARK OFFICE
CERTIFICATE OF CORRECTION

PATENT NO. : 4,532,536
DATED : July 30, 1985
INVENTOR(S) : KATSUNORI HATANAKA, ET AL.

Page 1 of 3

It is certified that error appears in the above-identified patent and that said Letters Patent is hereby corrected as shown below:

Col. 1, line 7, change "adoptable" to --which can be used.--

Col. 1, line 23, change "brings forth" to --has--.

Col. 1, line 34, change "input signal. to --input photo signal.--

Col. 1, line 35, change "photosensors, have" to --photosensors have--.

Col. 2, lines 27-8 change "of opera-/tions;" to --of the operations;--

Col. 2, line 49, change "advance" to --advantage--.

Col. 2, lines 49-50, change "is found in/that" to --is that--.

Col. 2, line 59, change "the host," to --the matrix or host,--.

Col. 3, line 6, change "a-Ge(H,X) and" to --a-Ge(H,X), poly-Si (H,X) and--.

Col. 3, lines 46-7, change "If/n-type is desired to form," to --If it is desired to form an n-type,--.

Col. 4, line 6, change "closely" to --close--.

Col. 4, line 6, change "and formed" to --and are formed--.

Col. 4, line 21, change "of normal" to --of the normal--.

Col. 4, line 21, change "of element" to -- of the element --.

Col. 4, line 22, change "(in case that fixed" to --(in a case where a fixed--.

UNITED STATES PATENT AND TRADEMARK OFFICE
CERTIFICATE OF CORRECTION

PATENT NO. : 4,532,536

DATED : July 30, 1985

INVENTOR(S) : KATSUNORI HATANAKA, ET AL.

It is certified that error appears in the above-identified patent and that said Letters Patent is hereby corrected as shown below:

Col. 4, lines 24-5, change "the invention is found/in" to --the present invention is--.

Col. 4, line 66, change "is to be put" to --inputted--.

Col. 4, line 68, change "304 is" to --304, respectively, is--.

Col. 5, line 6, change "the surface." to --that surface--.

Col. 5, line 10, change "put in to" to --inputted into--.

Col. 5, line 40, change "take up" to --receive--.

Col. 5, line 43, change "put in" to --inputted--.

Col. 5, line 45, change "is made" to --is--.

Col. 5, line 47, change "such material" to --material--.

Col. 5, line 54, change "304 must" to --304, respectively,--.

Col. 5, line 68, change "304." to --304, respectively.--

Col. 6, lines 6-7, change "de-/termined suitably so as" to --suitably determined--.

Col. 6, line 15, change "304 on" to --304, respectively, on--.

Col. 6, line 62, change "has an effect to prevent" to --prevents--.

Col. 6, line 66, change "Mo etc." to --Mo, etc.--.

Col. 7, lines 1-2, change "404/are" to --404, respectively, are--.

Col. 7, lines 4-5, change "light/intransmissible metal electrode material." to --a metal electrode material which does not transmit light.--

Col. 7, line 24, change "light non-transmissible material" to --material which does not transmit light--

UNITED STATES PATENT AND TRADEMARK OFFICE
CERTIFICATE OF CORRECTION

PATENT NO. : 4,532,536

DATED : July 30, 1985

INVENTOR(S) : KATSUNORI HATANAKA, ET AL.

It is certified that error appears in the above-identified patent and that said Letters Patent is hereby corrected as shown below:

Col. 7. line 31, change "except the" to --except at the--.

Col. 7, line 38, change "C2 there" to --C2, respectively, there--.

Col. 7, line 44, change "electrodes, the" to --electrodes including the--.

Col. 8, line 19, change "$2_1$" to --$Q_1$--.

Col. 8, line 29, change "$(S_1 1$" to --$(S_1-1$--.

Col. 8, line 42, change "$B_1-B_n$ respectively which" to --$B_1-B_n$, respectively, which--.

Col. 10, lines 34-5, change "in any one/of claims 1," to --in Claim 1, --.

Signed and Sealed this

Eleventh Day of November, 1986

Attest:

DONALD J. QUIGG

Attesting Officer     Commissioner of Patents and Trademarks